United States Patent [19]

Murota et al.

[11] Patent Number: 5,705,224
[45] Date of Patent: Jan. 6, 1998

[54] VAPOR DEPOSITING METHOD

[75] Inventors: Junichi Murota; Shoichi Ono, both of Sendai; Masao Sakuraba, Sapporo; Nobuo Mikoshiba, Sendai; Harushige Kurokawa, Higashimurayama; Fumihide Ikeda, Toyama, all of Japan

[73] Assignee: Kokusai Electric Co., Ltd., Tokyo, Japan

[21] Appl. No.: 393,821

[22] Filed: Jan. 31, 1995

Related U.S. Application Data

[63] Continuation-in-part of Ser. No. 143,392, Oct. 25, 1993, abandoned, which is a continuation of Ser. No. 851,890, Mar. 16, 1992, abandoned.

[30] Foreign Application Priority Data

Mar. 20, 1991 [JP] Japan .................................. 3-56931

[51] Int. Cl.⁶ .......................... C30B 23/00; C23C 16/00
[52] U.S. Cl. ................... 427/248.1; 427/586; 117/86; 117/92; 117/93; 117/103; 117/108
[58] Field of Search ........................ 427/586, 255.1; 117/86, 89, 92, 93, 103, 108

[56] References Cited

U.S. PATENT DOCUMENTS 5,443,033  8/1995  Nishizawa et al. ................. 117/86

FOREIGN PATENT DOCUMENTS

| 59-04829 | 5/1984 | Japan . |
| 60-16416 | 1/1985 | Japan . |
| 61-124123 | 6/1986 | Japan . |
| 63-110 | 1/1988 | Japan . |
| 63-55929 | 3/1988 | Japan . |
| 2208925 | 8/1990 | Japan . |
| 4254499 | 9/1992 | Japan . |
| 2162369 | 1/1986 | United Kingdom . |

OTHER PUBLICATIONS

Mechanism & Application of Laser Atomic Layer Epitaxy of GaAs, Y. Aoyagi et al, Chemtronics, 1989, pp. 117 through 122 no month.

GaAs Atomic Layer Epitaxy Using the KrF Excimer Laser, Yoshito Kawakyu et al, Japan App. Physics vol. 28 (8) 1989, pp. 1439–1441 no month.

Study of the Early State of Photochemical Vapor Deposition of Amorphous Silicon from Disilane on a SiO2 Substrate, Mitsuo Kawasaki et al, Japan App. Physics vol. 64(6) 1988, pp. 3254–3262 no month.

Doi et al., "Growth of GaAs by switched laser metalorganic vapor phase epitaxy", Appl. Phys. Lett. 48 (26) Jun. 30, 1986.

*Primary Examiner*—Michael Lusignan
*Assistant Examiner*—David M. Maiorana
*Attorney, Agent, or Firm*—David O'Reilly

[57] ABSTRACT

A vapor deposition apparatus and method in which pulse waveform light is applied to a sample sealed in a reaction chamber. The sample is exposed to gaseous material while the pulse waveform light is applied creating one or plural atomic layers. Alternate layers of plural substances or alternate multiple layers of plural substances can be formed by alternating the introduction of gaseous materials with the application of pulse waveform light.

14 Claims, 13 Drawing Sheets

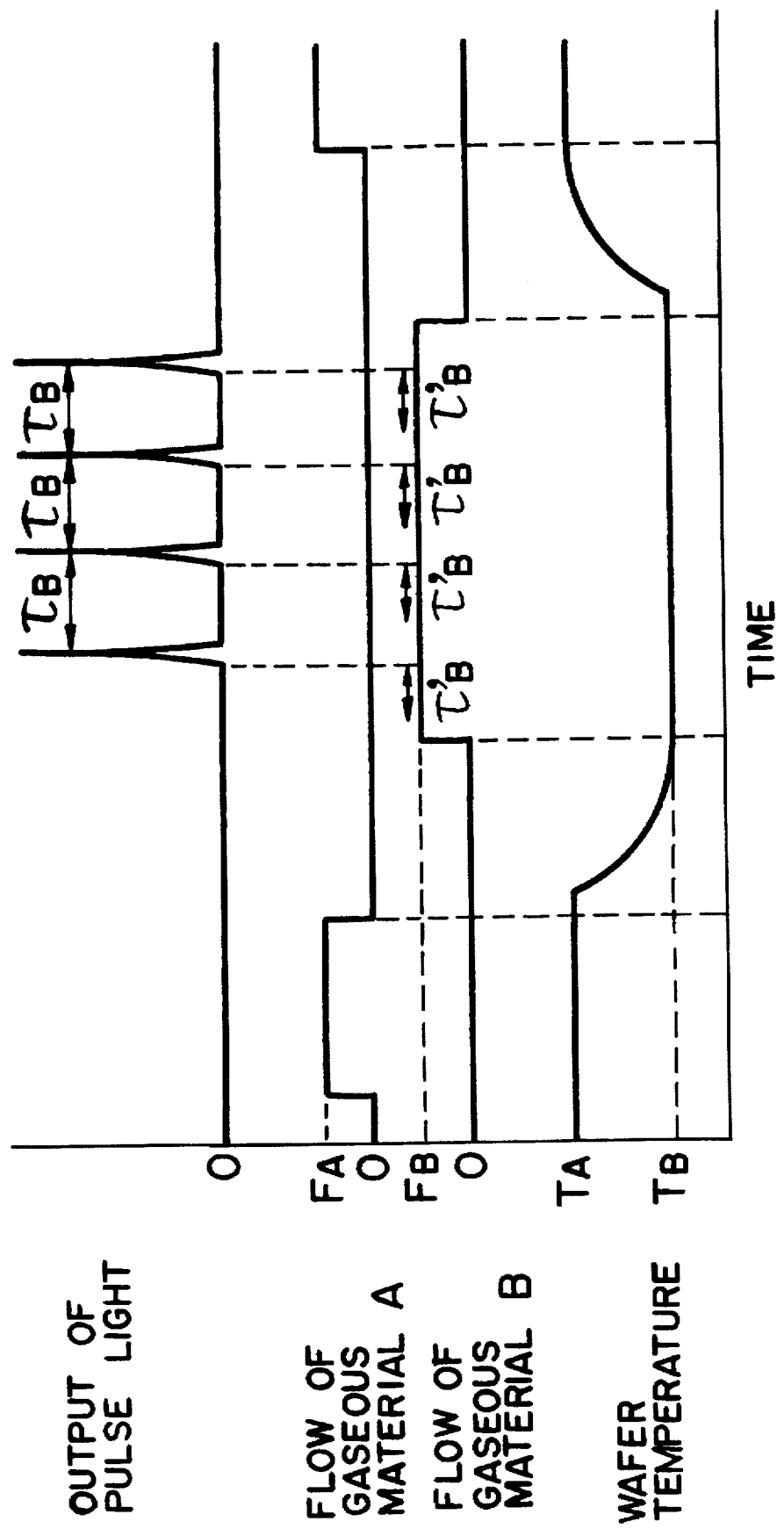

VAPOR DEPOSITING METHOD

This is a Continuation-In-Part of application Ser. No. 08/143,392 filed 25 Oct. 1993, now abandoned, which is a Continuation of application Ser. No. 07/851,890 filed 16 Mar. 1992, now abandoned.

BACKGROUND OF THE INVENTION

1. Field of the Invention

The present invention relates to a vapor deposition method for producing a film in the form of an atomic layer or in the form of plural atomic layers on a sample, for example a monocrystal silicon wafer in a reaction chamber by supplying gaseous material to be deposited on the sample.

2. Description of the Prior Art

There is a conventional vapor depositing method in which gaseous material flows from a gas source into a reaction chamber, while a sample in the reaction chamber is heated by a high frequency heater, thereby a CVD film is deposited on the sample. In such a method, since adsorption and reaction take place continuously on the surface of the sample, it is very difficult to produce a film in the form of an atomic layer or in the form of plural atomic layers.

Heretofore, in vapor deposition of a film in the form of an atomic layer or in the form of plural atomic layers, a compound semiconductor, such as GaAs of III and V group elements, has been well known. Atomic layer epitaxy of GaAs utilizes the characteristic of a compound semiconductor such that source material including As does not deposit on As but on Ga, and source material including Ga does not deposit on Ga but on As because of the difference of adsorbing energy. Source gases such as trimethylgallium (TMG), $AsH_3$ are alternately introduced into a chamber, a substrate is heated or light is applied to promote to adsorb and decompose the source material, and GaAs layer is produced in the form of an atomic layer or the form of plural atomic layers.

In case of an elemental semiconductor such as Si, Ge, because an element deposits on the same element continuously, it is difficult to control with precision of an atomic layer. To avoid the continuous deposition, source gases must be exhausted from a reaction chamber after source materials for a monoatomic layer are adsorbed, and the adsorbed source materials are decomposed due to an energy from light or heat. This method has a disadvantage that productive rate is not good because the switches of introduction and exhaust of sources gases must be repeated. This method has another disadvantage that hydride gases such as $GeH_4$, $SiH_4$ cannot be used as source gases because these gases tend to be easily removed from the substrate after adsorbed when the chamber is being exhausted or vacuumized. Consequently organic metallic gases or chloride gases must be used as source gases, which are not easy to handle and include impurities such as Cl, C.

BRIEF SUMMARY OF THE INVENTION

It is one object of the present invention to provide a new method in which the above repeated switches of introduction and exhaust of sources gases are not needed and that can control with precision of an atomic layer. Also in this method a compound semiconductor is formed with precision of an atomic layer without highly heating a substrate.

The object is achieved by a vapor depositing method for depositing one atomic layer at a time on a wafer sample comprising evacuating a reaction chamber, placing the wafer sample in the reaction chamber, heating the wafer sample to a first temperature to remove unnecessary adsorbed substances, cooling the wafer sample to a second temperature, supplying a reaction gas to the reaction chamber while the wafer sample is held constant at the second temperature, waiting a preselected lapse of time of at least 10 seconds for adsorption of said gaseous materials into the surface of said wafer sample, applying at least one pulse of light from a flash lamp to the sample wafer to decompose the adsorbed gaseous material while the reaction gas is being supplied, whereby approximately one atomic layer of decomposed gaseous material is formed on the wafer sample from the at least one pulse of light.

In the present invention, reaction gas is introduced from a gas source into the reaction chamber and the sample is exposed in the reaction chamber to the gaseous material. During supplying the reaction gas to the reaction chamber, the wafer sample is held constant at a lower temperature than that of conventional CVD methods to prevent the source material from continuously adsorbing on the wafer sample. After adsorption of the gaseous material on the surface of the wafer sample, the adsorbed substance is instantaneously decomposed and reacted by light of the pulse waveform from the flash lamp so that a film in the form of an atomic layer or in the form of plural atomic layers is produced on the sample. In this manner the adsorption of gaseous material can be separated from the decomposition and reaction of adsorbed substance.

Light applied to the sample wafer has to have a very narrow time width to prevent the gaseous material from continuously adsorbing and decomposing, and has to have high luminance and large emitting area to supply required energy to all the adsorbed material on the surface of the wafer sample. The inventors have found that a flash lamp is preferable to emit such a light. Incidentally, the light has to have adequate frequencies to supply energies to the wafer sample efficiently and not to supply energies to unadsorbed source gases. Light having less than 1000 nm wavelength is well absorbed by the wafer sample (for example Si), while light having less than 200 nm wavelength is absorbed by unadsorbed source gases and make them react. Therefore the light preferably has 200 nm to 1000 nm wavelengths. Xe flash lamp emitting light having 300 nm to 1000 nm wavelengths is preferable.

DETAILED DESCRIPTION OF THE EMBODIMENTS

Figure 1:
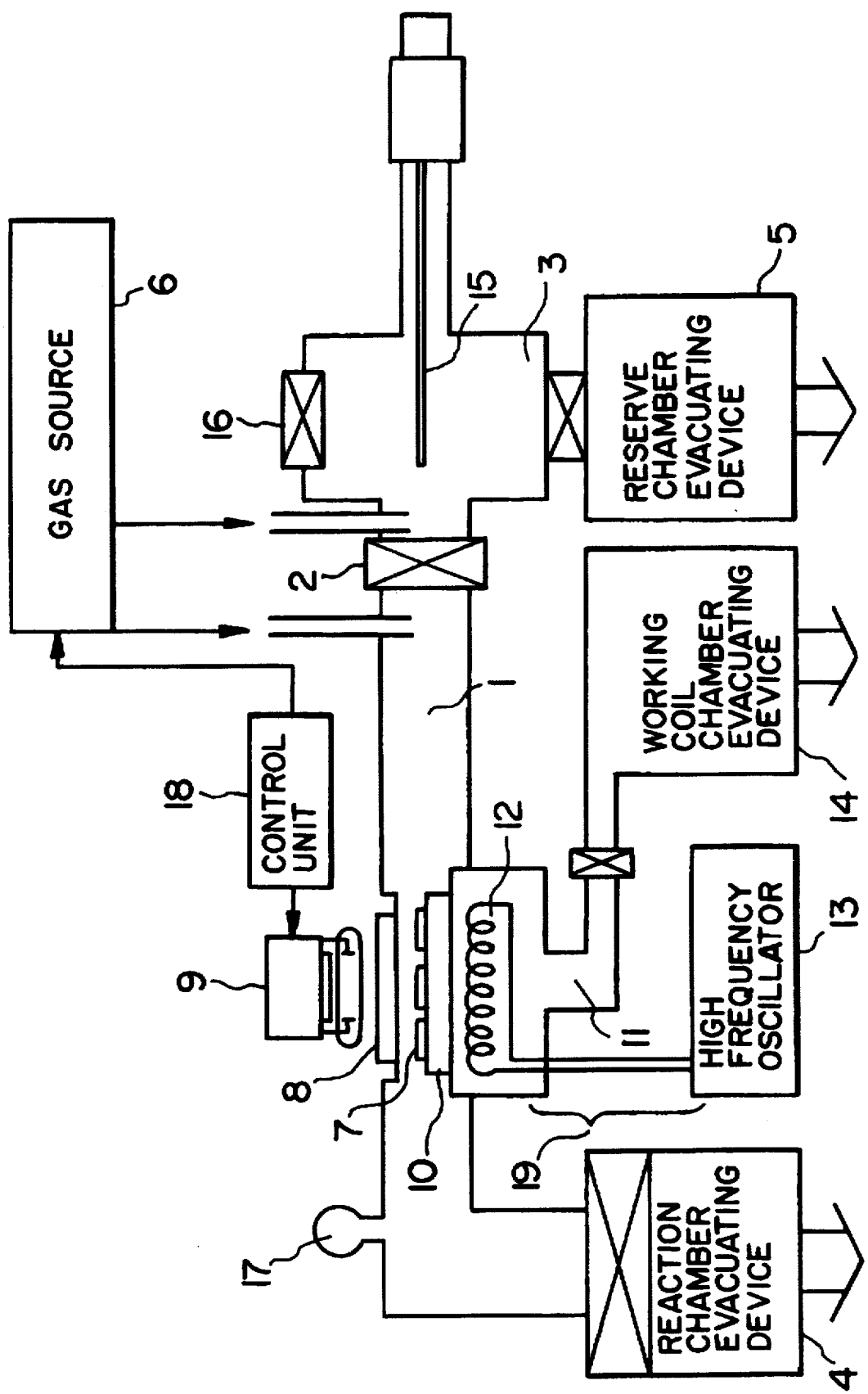
FIG. 1 is a schematic representation of an example of an apparatus according to the present invention, FIG. 2 graphically shows an example procedure for depositing germanium on a wafer, when the light from a xenon lamp is repeatedly applied to the surface of the wafer.

Referring to FIG. 1, an apparatus according to the present invention comprises reaction chamber 1, reserve chamber 3 communicating with reaction chamber 1 through door 2 of reaction chamber 1, reaction chamber evacuating device 4, reserve chamber evacuating device 5, gas source 6 for supplying gaseous material to reaction chamber 1 and to reserve chamber 3, and a flash lamp 9 for applying light from flash lamp 9 to the surface of sample 7 in reaction chamber 1 through transparent window 8.

The apparatus according to the present invention further comprises sample stand 10, working coil chamber 11 for supplementary heating of sample 7, said working coil chamber 11 being provided underneath sample stand 10. High frequency oscillator 13 supplies high frequency to working coil 12 provided in working coil chamber 11. Working coil chamber evacuating device 14 evacuates working coil chamber 11. Sample conveyor 15 provided in reserve chamber 3 conveys sample 7 to reaction chamber 1. Sample 7 is carried through door 16 into reserve chamber 3. Control unit 18 controls the application of light from the flash lamp to sample 7 in association with the introduction of gaseous material into reaction chamber 1. Reaction chamber 1 is provided with a pressure meter 17.

In the following a method for producing a film in the form of an atomic layer or in the form of plural atomic layers by using the above-mentioned apparatus according to the present invention is explained. The formation of a film is carried out by the following procedure; (1) reaction chamber 1 and working coil chamber 11 are evacuated by reaction chamber evacuating device 4 and working coil evacuating device 14, respectively, (2) thereafter carrier gas such as hydrogen is supplied from gas source 6 to reaction chamber 1 which has been evacuated, (3) reserve chamber 3 is filled with inert gas such as nitrogen so that the pressure of reserve chamber 3 equals to the atmospheric pressure, then door 16 of reserve chamber 3 is opened, and after the sample is placed on sample conveyer 15 in reserve chamber 3, door 16 is shut, (4) reserve chamber 3 is evacuated by reserve chamber evacuating device 5 to a reduced pressure, while the same gas as the gas supplied to reaction chamber 1 is supplied to reserve chamber 3, (5) the door 2 of reaction chamber 1 is opened, and sample 7 is carried from reserve chamber 3 into reaction chamber 1 by sample conveyor 15, placed on sample stand 10, sample conveyor 15 is returned to reserve chamber 3, and door 2 is shut, (6) high frequency is applied to working coil 12 from high frequency oscillator 13, thereby sample stand 10 is heated, to heat sample 7, wherein heating of sample 7 is carried out with a view to promoting decomposition and reaction of gaseous material under application of light from a flash lamp, or with a view to separating an unnecessary adsorbed substance on the surface of sample 7, or with a view to forming a film by a conventional chemical vapor depositing method, (7) thereafter gaseous material is supplied from gas source 6 to reaction chamber 1, and (8) after the time required for adsorbing gaseous materials on the surface of sample 7, light from a flash lamp is applied from flash lamp 9 to the surface of sample 7 through transparent window 8.

In the method according to the present invention, the application of light from flash lamp 9 to the sample is controlled in association with the flow of gaseous material into reaction chamber 1 by control unit 18, and plural kinds of gaseous materials can flow into reaction chamber 1 at the same time or alternately. Further, after applying light from flash lamp 9 to sample 7 while one gaseous material flows into reaction chamber 1, another gaseous material flows into reaction chamber 1, and then by heating sample 7, different substances can be deposited on sample 7.

Figure 2:
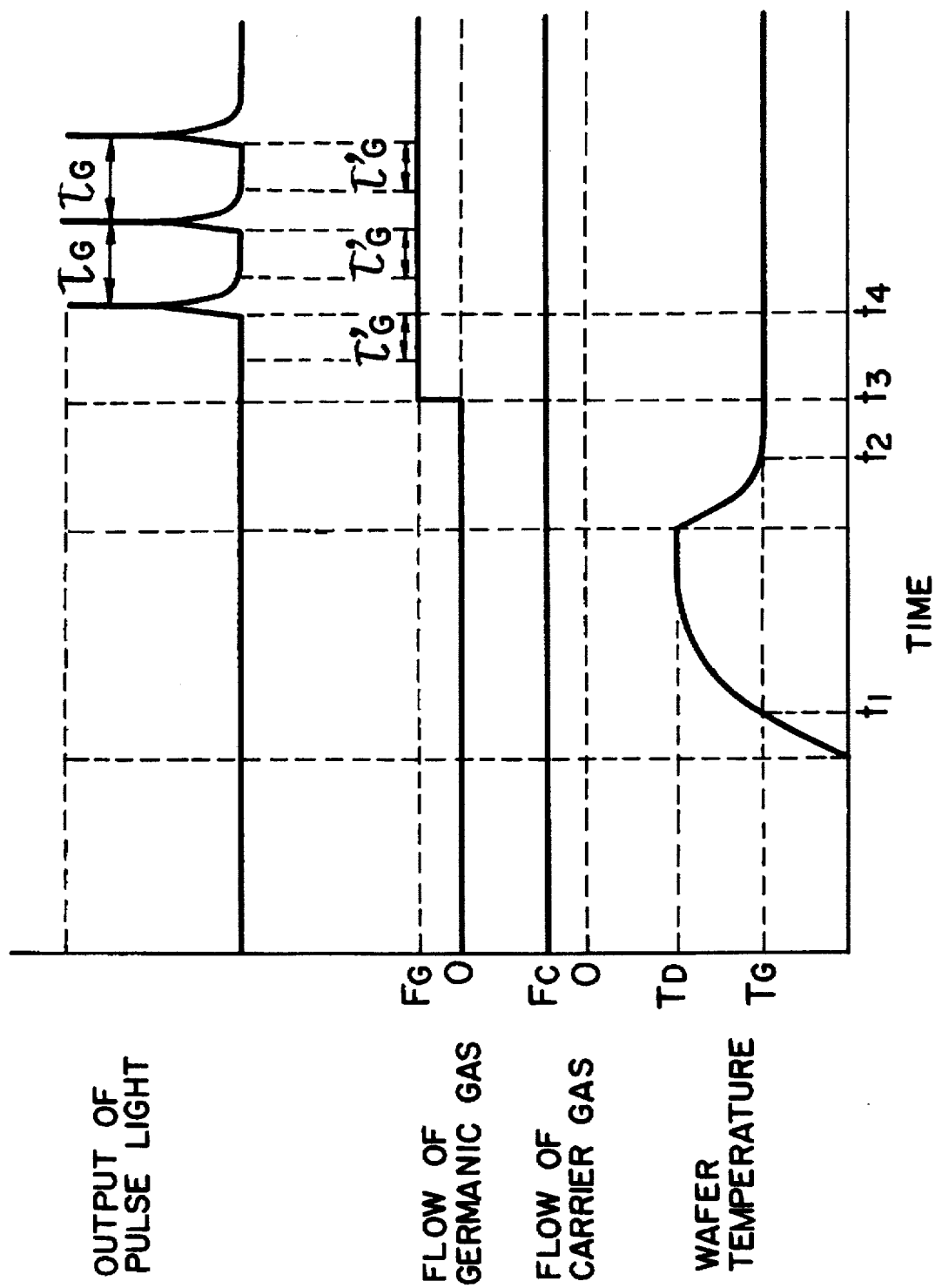

FIG. 2 is a graphical representation of a time schedule for the application of pulse waveform light to a monocrystal silicon wafer and the introduction of germanic gas into the reaction chamber, together with the output of the pulse waveform light, flow of germanic gas, flow of carrier gas, and change of wafer temperature with time, wherein there is represented an example of a procedure for depositing germanium on a wafer, when the light from a xenon lamp is repeatedly applied to the surface of the wafer.

Referring to FIG. 2, one example procedure when forming germanium for example on a monocrystal silicon wafer is explained. Hydrogen gas 200 cc/min flows into reaction chamber 1. When the pressure inside reaction chamber 1 reaches 270 Pa, the monocrystal silicon wafer (sample 7) is placed on sample stand 10, heated to a wafer temperature TG between 230° C. and 290° C. at time $t_1$, further heated to temperature TD of more than 400° C. so that unnecessary material adsorbed on the surface of wafer is removed, and thereafter cooled to a wafer temperature TG at time $t_2$.

Then, germanic gas (GeH$_4$) is introduced into reaction chamber 1 at time $t_3$ that the partial pressure reaches 1–20 Pa, and after the lapse of time $\tau'_G$ required for the germanic gas to be adsorbed on the sample 7, light from a xenon flash lamp with intensity of 20 J/cm$^2$ and pulsewidth of 1 msec is repeatedly applied to the surface of monocrystal silicon wafer at time $t_4$ ($\tau_G$ designates the repeated pulse interval of the light of pulse waveform).

Figure 3:
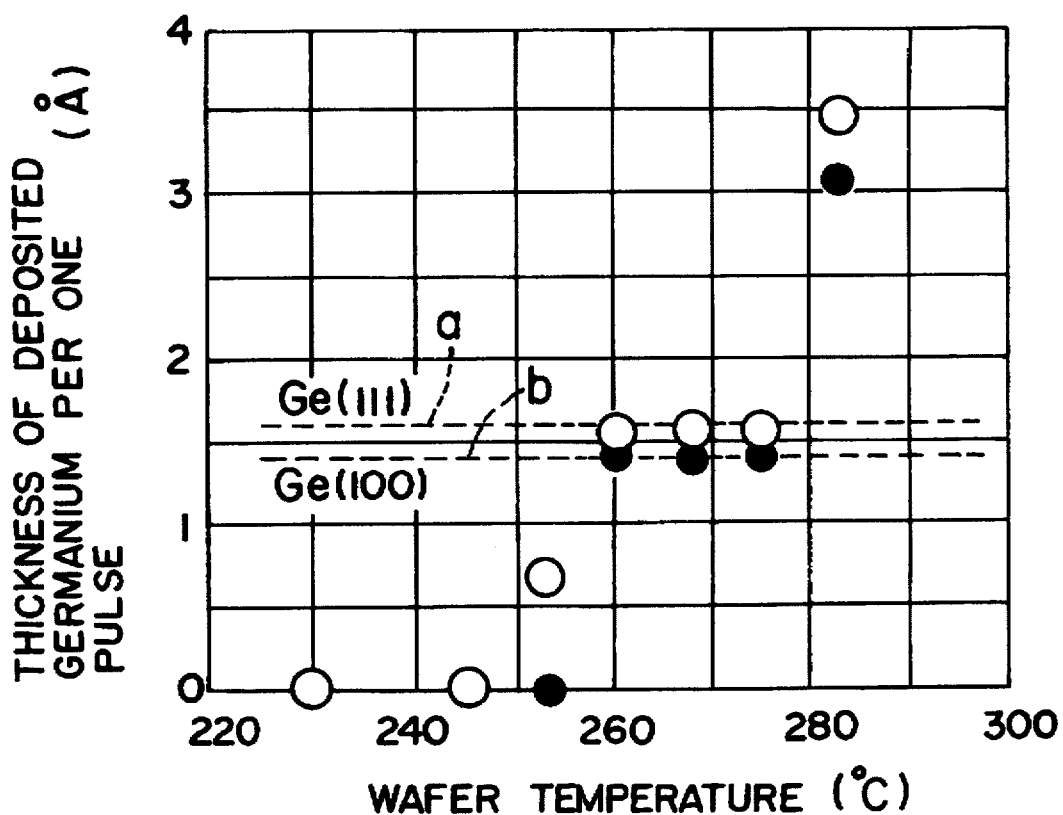
FIG. 3 is a graphical representation of variation of thickness (Å) of deposited germanium on a monocrystal silicon wafer per pulse relative to wafer temperature (°C), when light from a xenon flash lamp is repeatedly applied to the surface of the wafer.

The thickness of germanium film deposited on sample 7 per pulse according to the above-mentioned method, is investigated. When the total pressure of GeH$_4$-H$_2$ gas mixture is 280 Pa, the partial pressure of germanic gas (GeH$_4$) is 13 Pa, and the pulse interval $\tau_G$ is 20 seconds, the deposition of one atomic layer of germanium per pulse is recognized on Si of lattice type (1 0 0) and Si of lattice type (1 1 1), respectively, at a temperature between 260° C. and 275° C. without depending upon temperature as shown in FIG. 3, in which ○ designates the thickness of germanium deposited on Si of the lattice type (1 1 1) per pulse, ● designates the thickness of germanium deposited on Si of the lattice type (1 0 0) and broken line "a" designates the change of the thickness of one atomic layer of Ge of lattice type (1 1 1), and broken line "b" designates the change of the thickness of one atomic layer of Ge of the lattice type (1 0 0) with a wafer temperature (the same applies to FIGS. 4–5).

Figure 4:
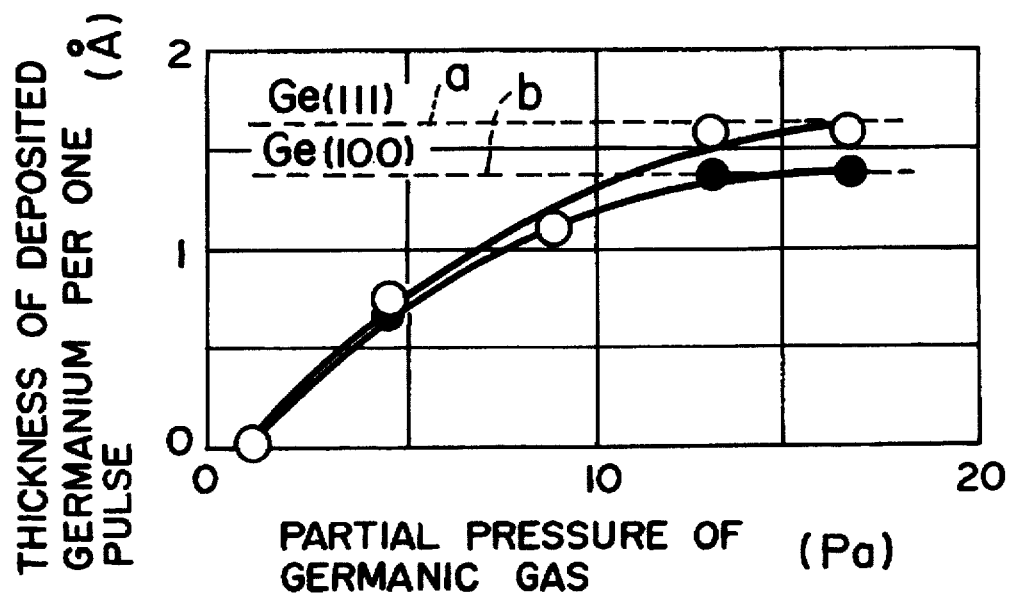
FIG. 4 is a graphical representation of variation of thickness (Å) of deposited germanium on a monocrystal silicon wafer per pulse relative to partial pressure (Pa) of germanic gas inside the reaction chamber, when light from a xenon flash lamp is repeatedly applied to the surface of the wafer.

When the pulse interval $\tau_G$ is 20 seconds, the total pressure of GeH$_4$-H$_2$ gas mixture is 280 Pa, and the wafer temperature is 268° C., it is recognized that at a partial germanic gas pressure of more than 13 Pa, germanium of one atomic layer per pulse is deposited as shown in FIG. 4.

Figure 5:
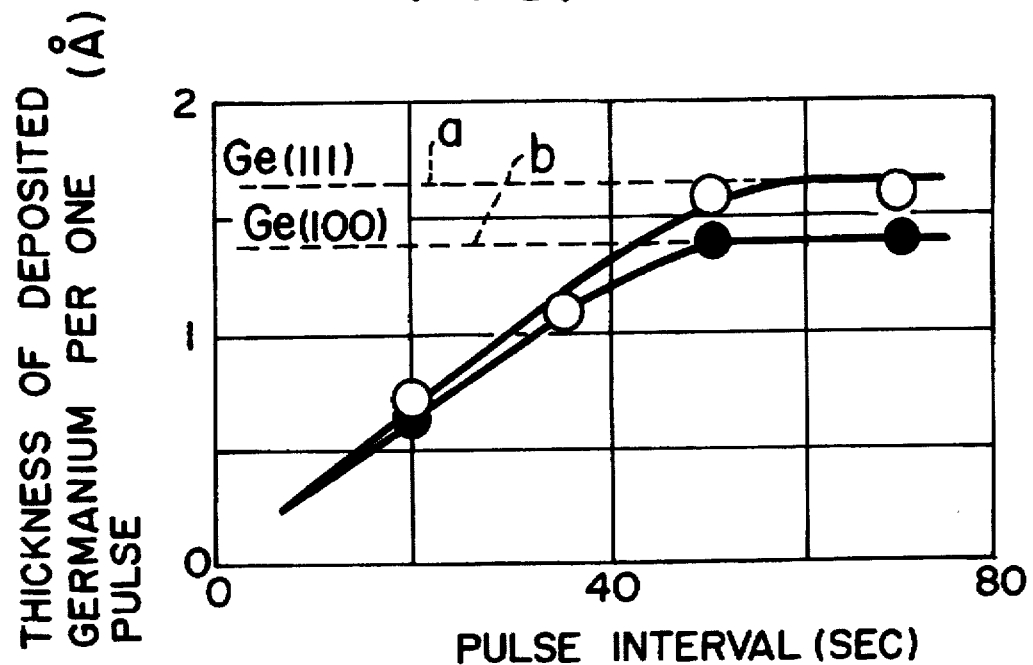
FIG. 5 is a graphical representation of variation of thickness (Å) of deposited germanium on a monocrystal silicon wafer per pulse relative to the pulse interval (sec.), when light from a xenon flash lamp is repeatedly applied to the surface of the wafer.

When the total pressure of GeH$_4$-H$_2$ gas mixture is 280 Pa, the wafer temperature is 268° C. and a partial germanic gas pressure is 4.5 Pa, it is recognized also that germanium of one atomic layer pep pulse is deposited when pulse interval is longer as shown in FIG. 5.

Figure 6:
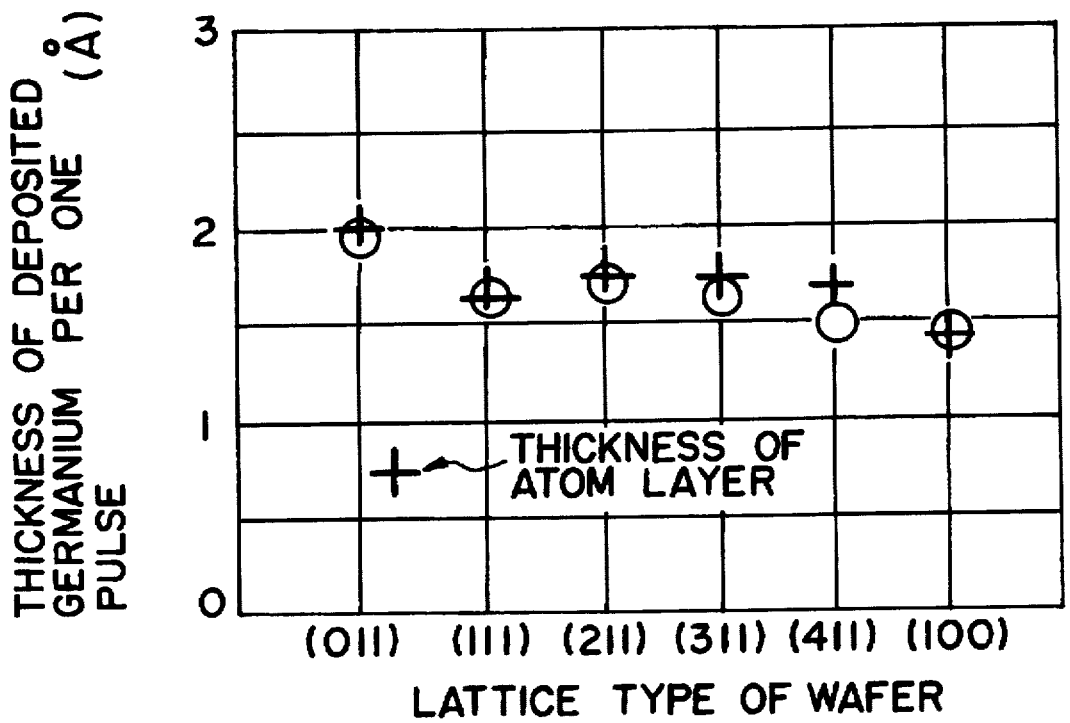
FIG. 6 is a graphical representation of variation of thickness of deposited germanium on a monocrystal silicon wafer per pulse (Å) with a lattice type (orientation) wafer, when light from a xenon flash lamp is repeatedly applied to the surface of monocrystal silicon wafer, FIG. 7 graphically shows an example procedure for forming a multiatomic layered film including an alternately superimposed layer of substance B on a layer of substance A on a wafer, gaseous materials A and B being alternately introduced into the reaction chamber, light from a xenon flash lamp being applied to the wafer once per introduction of respective gaseous materials A and B into the reaction chamber and a multiatomic layered film including alternately superimposed layer of substance B on layer of substance A being formed.

However at a temperature between 230° C. and 290° C., unless light from flash lamp 9 is applied to sample 7, deposition of germanium is not recognized. When the wafer temperature is 268° C., the pulse interval $\tau_G$ is 20 seconds, the total pressure of GeH$_4$-H$_2$ gas mixture is 280 Pa, and a partial germanic gas pressure is 13 Pa, deposition of one atomic layer per pulse of germanium corresponding to the respective lattice types is recognized as shown in FIG. 6.

Figure 15:
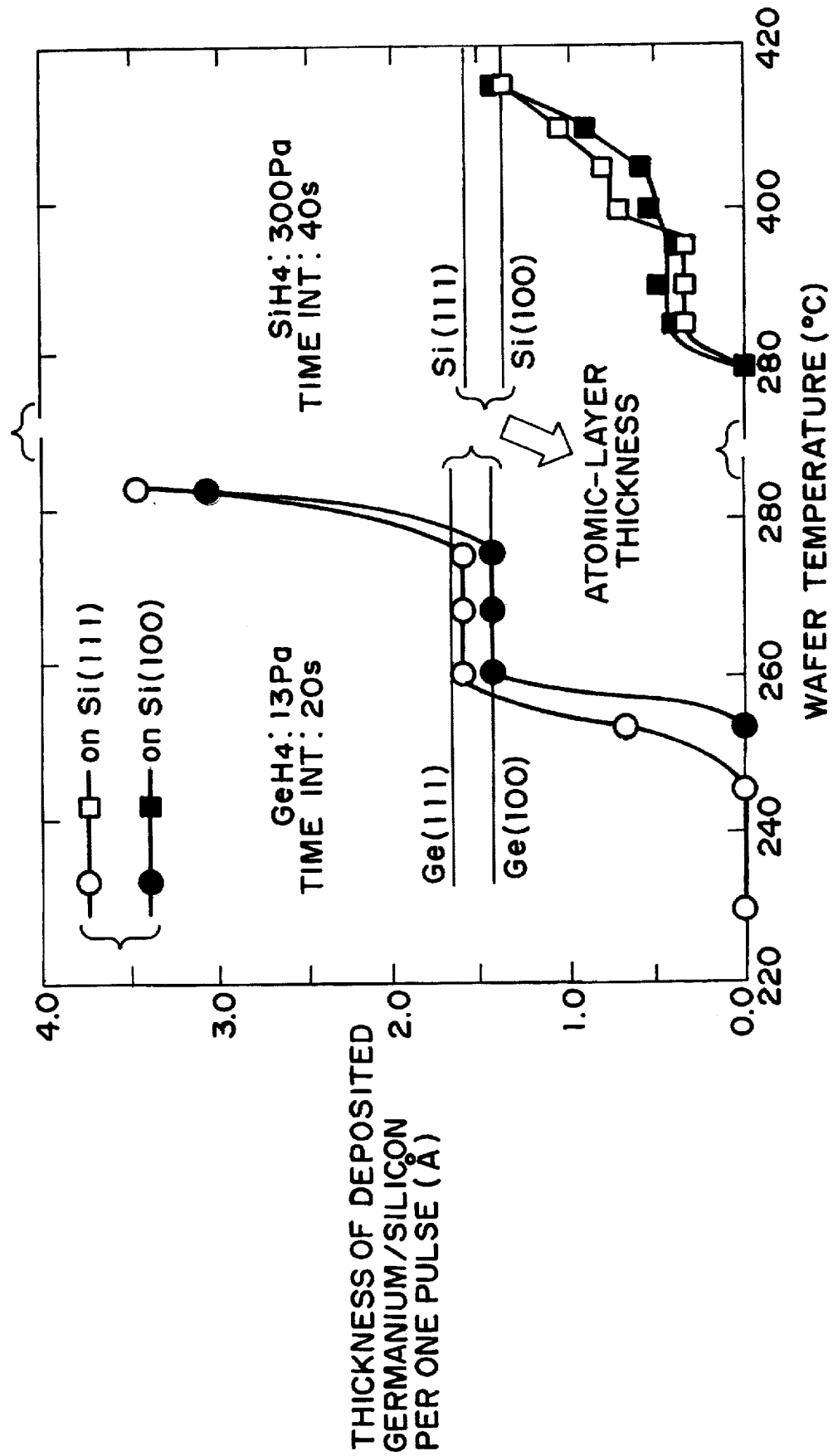
FIG. 15 is a graphical representation of variations of thickness (Å) of deposited germanium and silicon on a monocrystal silicon wafer per pulse relative to wafer temperature (°C), when light from a xenon flash lamp is repeatedly applied to the surface of the wafer.
Figure 16:
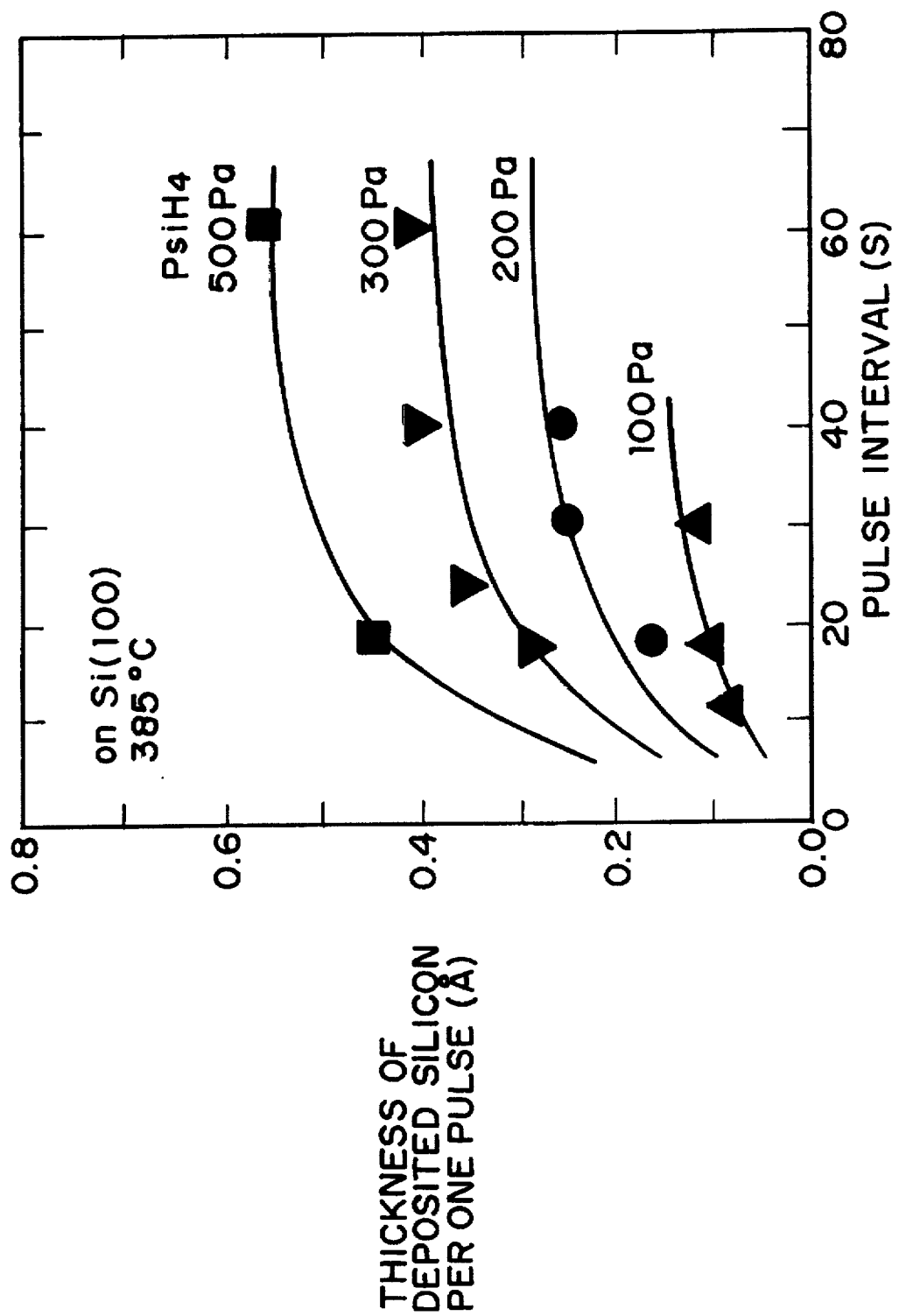
FIG. 16 is a graphical representation of variation of thickness (Å) of deposited silicon on a monocrystal silicon wafer per pulse relative to the pulse interval (sec.), when light from a xenon flash lamp is repeatedly applied to the surface of the wafer.
Figure 17:
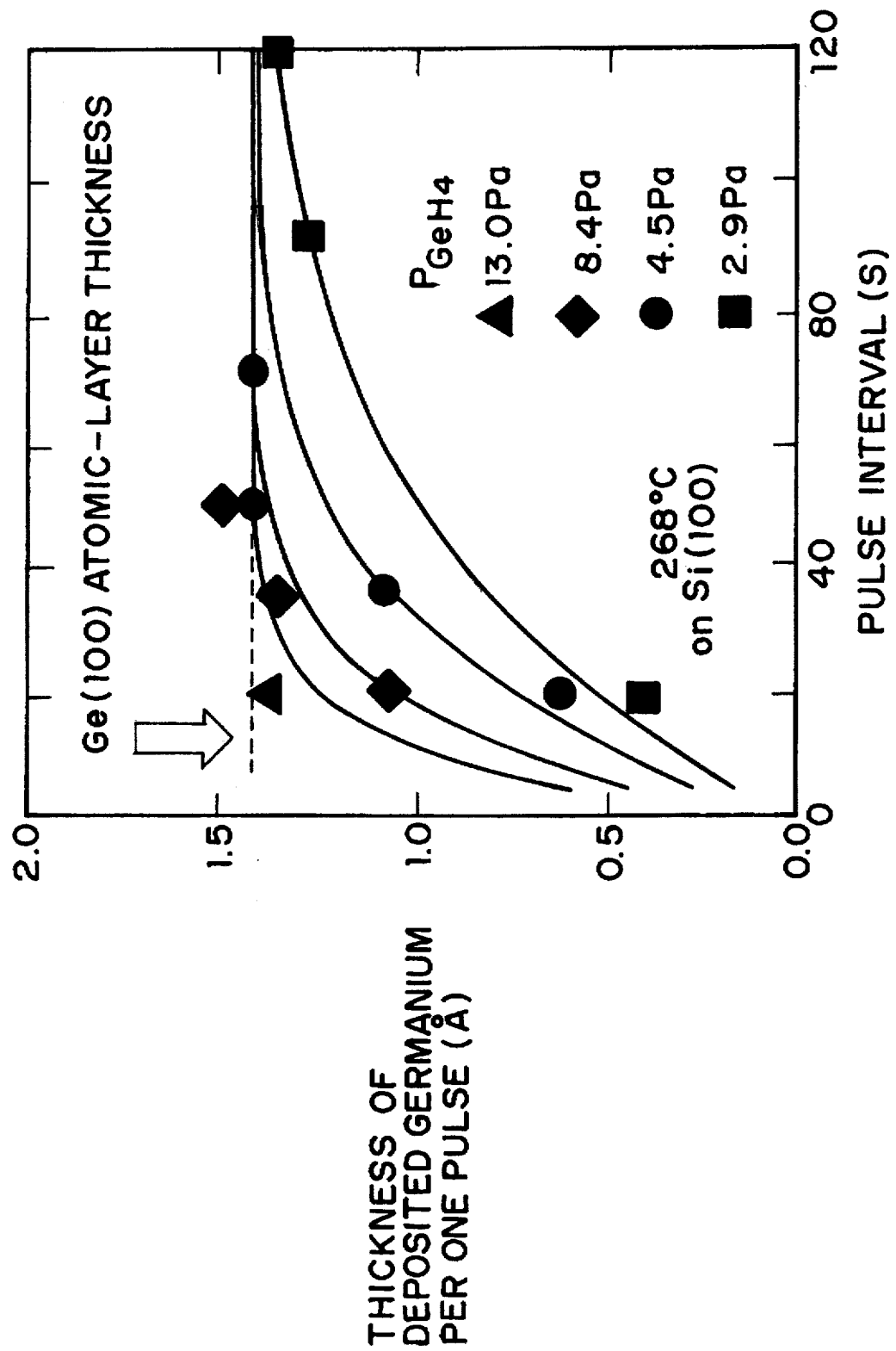
FIG. 17 is a graphical representation of variation of thickness (Å) of deposited germanium on a monocrystal silicon wafer per pulse relative to the pulse interval (sec.), when light from a xenon flash lamp is repeatedly applied to the surface of the wafer.

In the case of Si layer growth, the thickness deposited per pulse becomes independent of the wafer temperature in the range of 385°–395° C. as shown in FIG. 15 while of 260°–275° C. for Ge layer growth. In these temperature ranges, the pulse time interval dependences of the film thickness deposited per one pulse on Si (1 0 0) using SiH$_4$ and GeH$_4$ are shown in FIGS. 16 and 17. It is found that the deposited thickness increases and then saturates with the time interval. This saturation means that continuous SiH$_4$ or GeH$_4$ decomposition during the interval negligibly occurs, and SiH$_4$ or GeH$_4$ adsorption should be self-limited. As shown in FIG. 16, the deposited Si thickness in the saturation region is dependent on the SiH$_4$ partial pressure. This means that the saturated amount of adsorbed SiH$_4$ molecules is determined by the balance between adsorption and desorption of SiH$_4$ under the investigated conditions. On the other hand, the deposited Ge thickness in the saturation region is equal to the single-atomic-layer thickness, as shown in FIG. 17. It should be noted that the obtained sample surface is atomically flat within the detection limit. Similar results were obtained on other oriented (lattice type) wafer samples. Therefore it is proposed that the total adsorption site density is nearly equal to the surface atom density.

Now, assuming that a MH$_4$ (SiH$_4$ or GeH$_4$) molecule is adsorbed at a single adsorption site, the total adsorption site density at the surface $n_0$ can be described by $$n_0 = Q_s + Q_{MH_4} \tag{1}$$

Here, $Q_s$ is the density of surface sites where MH$_4$ and other species are not adsorbed, and $Q_{MH4}$ is the site density of adsorbed MH$_4$. It is also assumed that the adsorption of atomic hydrogen or other species is negligibly small compared with $Q_s$ and $Q_{MH\ 4}$. Then, the surface coverage velocity of MH$_4$ is given by $$\frac{dQ_{MH_4}}{dt} = k_{MH_4} P_{MH_4} Q_s - k_{-MH_4} Q_{MH_4} \tag{2}$$

$$= k_{MH_4} P_{MH_4} n_0 - (k_{MH_4} P_{MH_4} + k_{-MH_4}) Q_{MH_4},$$

where $k_{MH\ 4}$ and $k_{-M\ H4}$ are the rate constants of MH$_4$ adsorption and desorption, respectively, and $P_{MH\ 4}$ is the MH$_4$ partial pressure. Assuming that $Q_{M\ H4} = 0$ at $t=0$, the integration of eq.(2) gives $$Q_{MH_4} = \frac{k_{MH_4} P_{MH_4} n_0}{k_{MH_4} P_{MH_4} + k_{-MH_4} \times} \tag{3}$$

$$\{1 - \exp[-k_{MH_4} P_{MH_4} + k_{-MH_4}]t]\}$$

The thickness deposited per pulse ($d_L$) can be expressed by the product of the atomic-layer thickness ($d_{AL}$) and the surface coverage ($Q_{MH\ 4}/N$, N is the surface atom density) as $$d_b = d_{AL} \frac{Q_{MH_4}}{N} \quad (4)$$

$$= d_{AL} \frac{n_0}{N} \cdot \frac{k_{MH_4} P_{MH_4}}{k_{MH_4} P_{MH_4} + k_{-MH_4} \times}$$

$$\{1 - \exp[-k_{MH_4} P_{MH_4} + k_{-MH_4})t]\}$$

In the case of Si growth, $n_0/N=1$ and $k_{-s\ iH4}/k_{si\ H4}=740$ are obtained from the $d_{AL}/d_L$ versus $P^{-1}_{Si\ H4}$ plot based on eq. (4) using the data in the saturation regions in FIG. 16. In the case of Ge growth, since $d_L$ is $d_{AL}$ regardless of $P_{Ge\ H4}$ at a longer time interval for reaching adsorption equilibrium, as mentioned above, $k_{-G\ eH\ 4}$ is negligibly small compared with $k_{Ge\ H4} P_{Ge\ H4}$ and $n_0=N$. Finally, the values of the remaining parameters, $k_{Si\ H4}$, $k_{-S\ iH\ 4}$ and $k_{Ge\ H4}$ are calculated by substituting the data shown in FIGS. 16 and 17. The solid curves shown in FIGS. 16 and 17 are calculated from eq. (4) with $n_0=N$ using the following parameters: $d_{AL}=1.36$ Å, $k_{Si\ H4}=7.0\times10^{-5} Pa^{-1}s^{-1}$, $k_{-S\ iH4}=5.2\times10^{-2}s^{-1}$ on Si(1 0 0) and $d_{AL}=1.41$ Å, $k_{Ge\ H4}=8.3\times10^{-5} Pa^{-1}s^{-1}$, neglecting $k_{-Ge\ H4}$ on Ge(1 0 0). The calculated curves are in excellent agreement with the experimental data. For (1 1 1) wafer sample orientation, the same order of $k_{MH\ 4}$ and $k_{-M\ H4}$, and $n_0=N$ also gave similar excellent agreement. These results suggest that the total adsorption site density is equal to the surface atom density and a $SiH_4$ and $GeH_4$ molecule occupies only one adsorption site. Using the Langmuir-type eq. (4) with the above parameters, the single-atomic-layer growths per pulse of Si and Ge are expected in the $SiH_4$ and $GeH_4$ partial pressure ranges of above a few thousands Pa and a few Pa, respectively.

As above-mentioned, it is apparent that the application of pulse, waveform light to sample 7 while exposing sample 7 to gaseous material makes it possible to form a thin film of one atomic layer per pulse. Further, it is well known that formation of one atomic layer of mixed crystal is possible by a flow of material gas mixture including material gases of more than one kind at the same time into reaction chamber 1.

Figure 7:
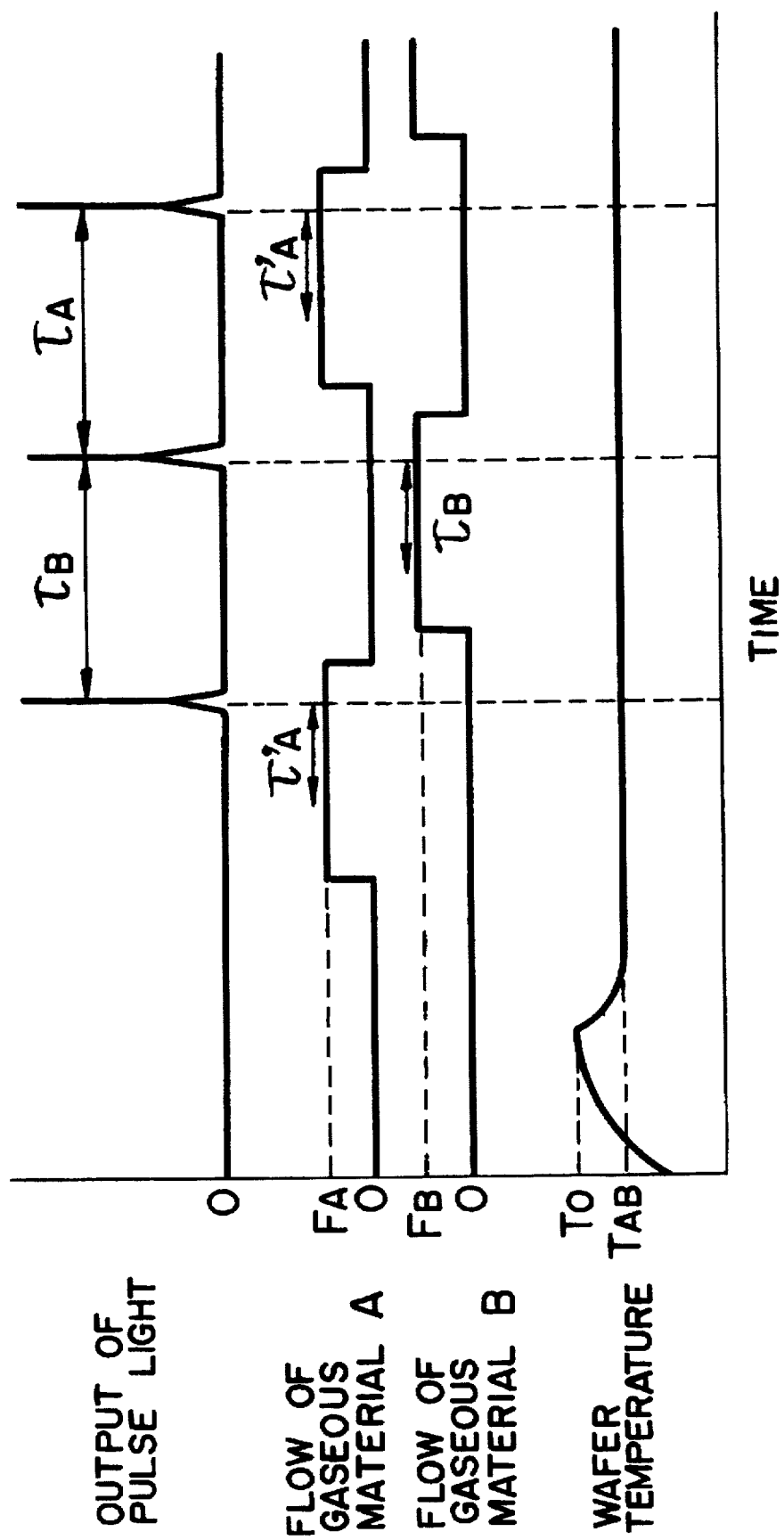

FIG. 7 is a graphical representation of a time schedule for the application of pulse waveform light to a monocrystal silicon wafer, the introduction of gaseous material A into the reaction chamber, and the introduction of gaseous material B into the reaction chamber, together with an output of pulse waveform light, flow of gaseous material A, flow of gaseous material B, and change of the wafer temperature with time. The graph illustrates an example procedure for forming a multiatomic layered film including alternately superimposing a layer of substance B on a layer of substance A on the wafer. The multiatomic layered film including alternately superimposed layer of substance B on layer of substance A is formed by the alternate introduction of gaseous materials A and B into the reaction chamber and the application of light from a xenon flash lamp to the wafer once per introduction of respective gaseous materials A and B into the reaction chamber.

Figure 8:
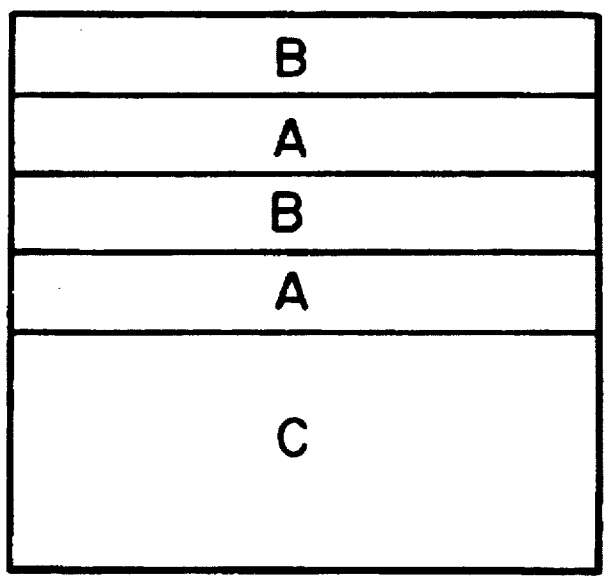
FIG. 8 is a sectional view of the multiatomic layered film formed on a wafer according to the procedure graphically shown in FIG. 7, FIG. 9 graphically shows an example procedure for forming a film including three alternately superimposed layers of substance B on three layers of substance A on a wafer, gaseous materials A and B being alternately introduced into the reaction chamber, light of xenon flash lamp being applied to the wafer three times per introduction term of respective gaseous materials A and B into the reaction chamber, and a multiatomic layered film including alternately superimposed layers of substance B on layers of substance A being formed.

According to the procedure shown in FIG. 7, the formation of a multilayered film in which one atomic layer of one substance A is arranged alternately with one atomic layer of another substance B on wafer C as shown in FIG. 8 is possible by controlling the application of light from flash lamp 9 to the sample 7 in association With the introduction of gaseous material into the reaction chamber 1, and by interchanging alternately one gaseous material A with another gaseous material B as shown in FIG. 7. In the figure, $\tau_A$ and $\tau_B$ designate the pulse intervals when substances A and B are deposited on sample 7, respectively, $\tau'_A$ and $\tau'_B$ designate the times required for material gases of substances A and B to be adsorbed into the surface of sample 7, and C designates the wafer.

Figure 9:
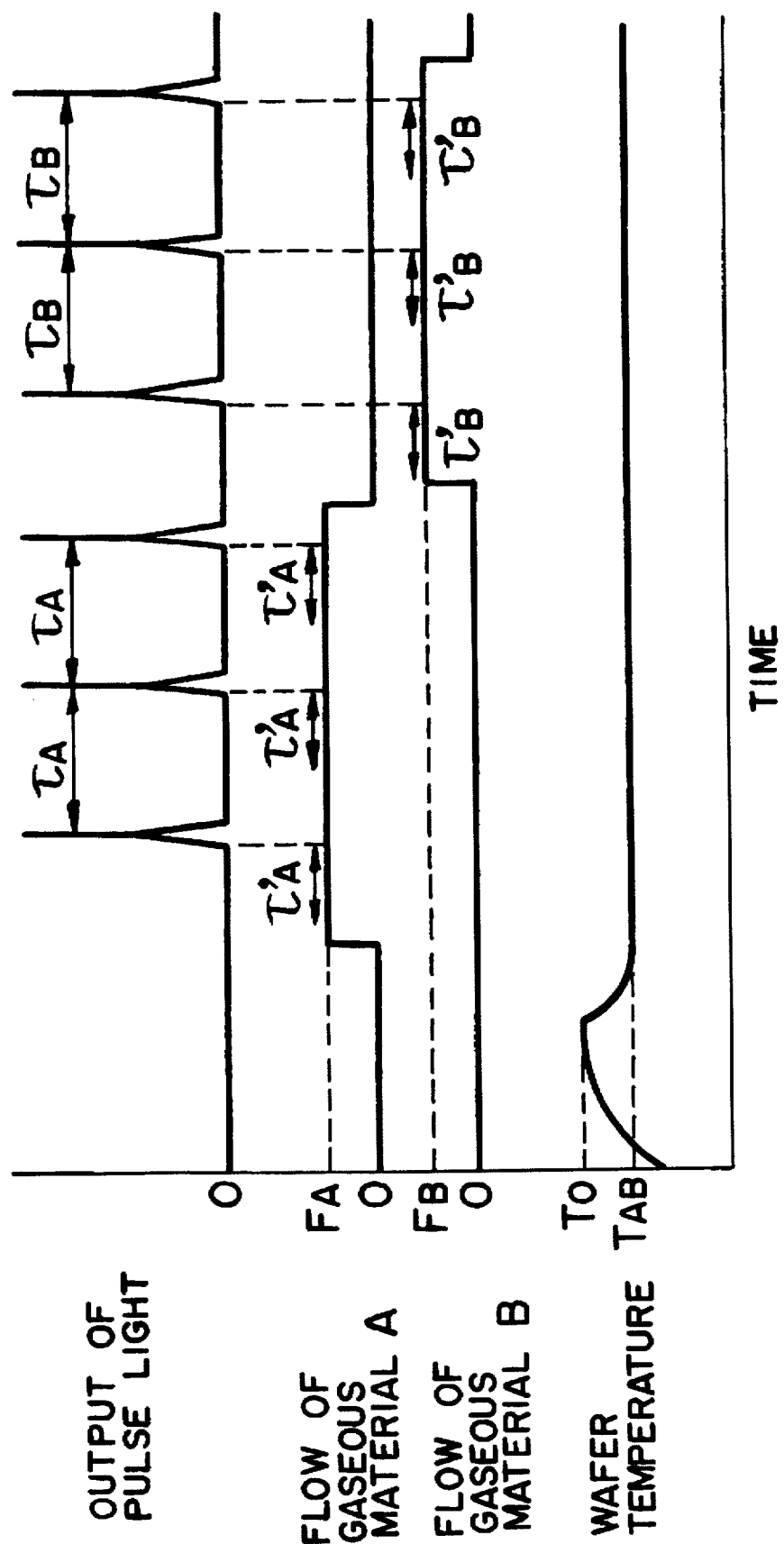

FIG. 9 is a graphical representation of a time schedule for the application of pulse waveform light to a monocrystal silicon wafer, the introduction of gaseous material A into the reaction chamber, and the introduction of gaseous material B into the reaction chamber, together with output of pulse waveform light, flow of gaseous material A, flow of gaseous material B, and change of the wafer temperature with time. The graph illustrates an example procedure for forming a film including three alternately superimposed layers of substance B on three layers of substance A on the wafer. This film is formed by the alternate introduction of gaseous materials A and B into the reaction chamber and the application of light from a xenon flash lamp to the wafer three times per introduction term of respective gaseous materials A and B into the reaction chamber.

Figure 10:
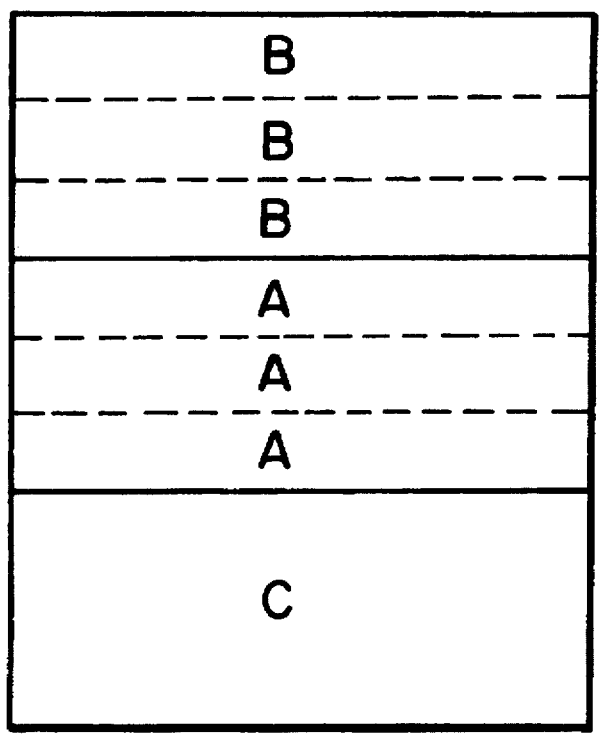
FIG. 10 is a sectional view of the multiatomic layered film formed on a wafer according the procedure shown in FIG. 9, FIG. 11 graphically shows an example procedure for forming a film including three alternately superimposed layers of substance B on three layers of substance A on a wafer, gaseous materials A and B being alternately introduced into the reaction chamber, light from a xenon flash lamp being applied to the wafer three times per introduction term of respective gaseous materials A and B into the reaction chamber, wafer temperature being changed in association with the introduction terms of respective gaseous material A and B, and a multiatomic layered film including alternately superimposed layers of substance B on layers of substance A being formed.

According to the procedure shown in FIG. 9, the formation of a multilayered film in which plural atomic layers of one substance A are arranged alternately with plural layers of another substance B at an interval of some number of layers is possible by controlling the application of light from flash lamp 9 to sample 7, and by interchanging one gaseous material A with another gaseous material B each time as shown in FIG. 10.

Figure 11:
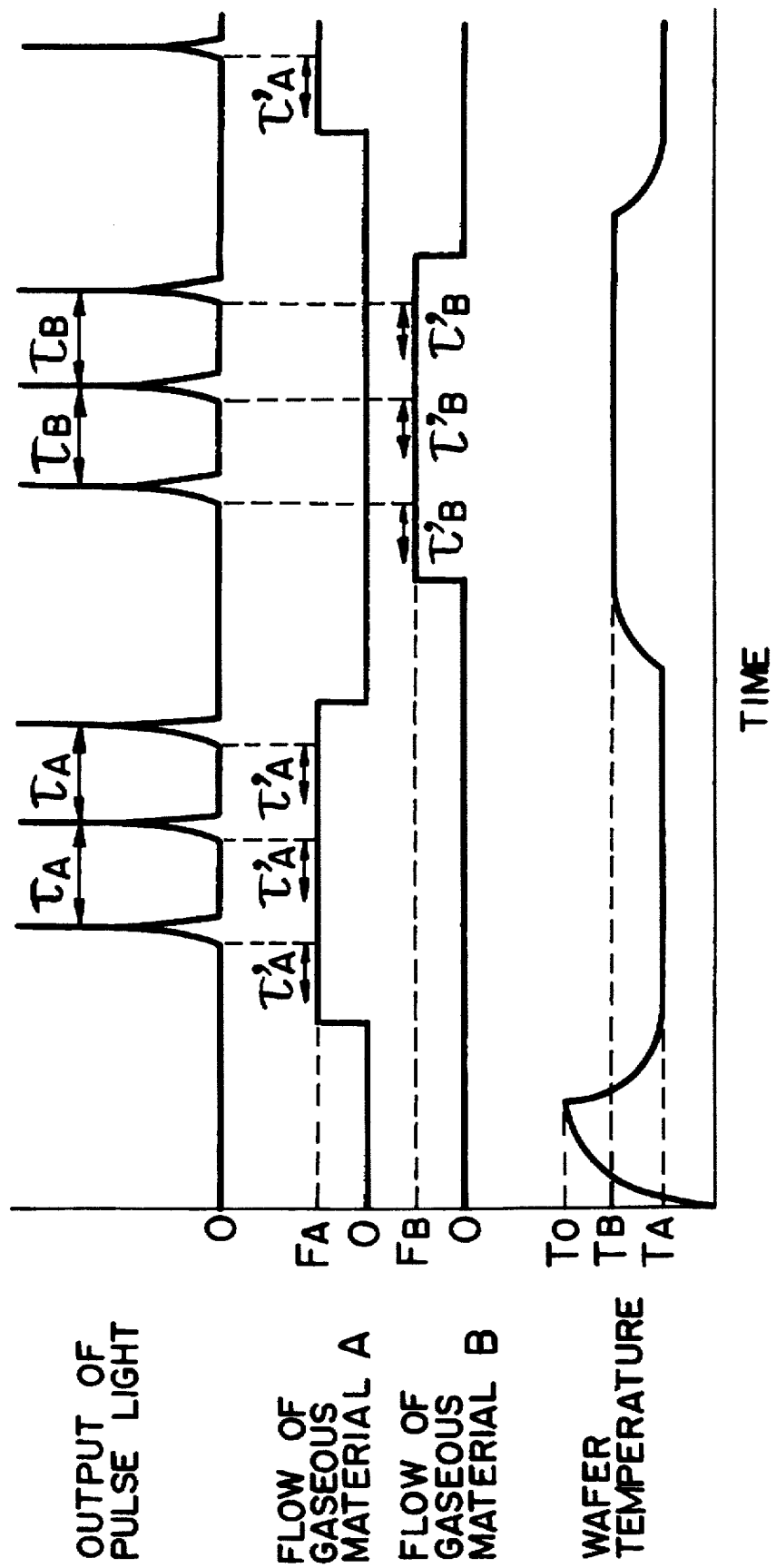
Figure 12:
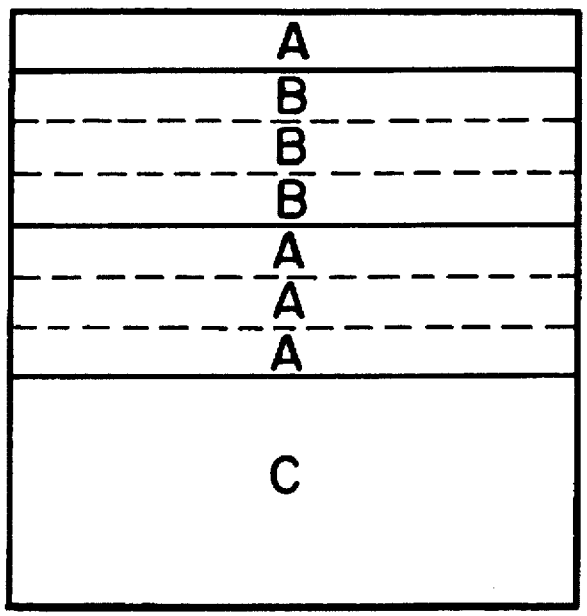
FIG. 12 is a sectional view of the multiatomic layered film formed on a wafer according the procedure shown in FIG. 11, FIG. 13 graphically shows an example procedure for forming a film including three alternately superimposed layers of substance B on three layers of substance A on a wafer, a layer of substance A being formed according to conventional vapor deposition without applying light from a pulse waveform to the wafer and a plurality of layers of substance B being formed on the layer of substance A by applying light from a pulse waveform to the wafer according to the present invention.

FIG. 11 is a graphical representation of a time schedule for the application of pulse waveform light to a monocrystal silicon wafer, the introduction of gaseous material A into the reaction chamber, and the introduction of gaseous material B into the reaction chamber, together with output of the light of pulse waveform, flow of gaseous material A, flow of gaseous material B, and change of the wafer temperature with time. The graph illustrates an example procedure for forming a film including three alternately superimposed layers of substance B on three layers of substance B on the wafer. This film is formed by the alternate introduction of gaseous materials A and B into the reaction chamber, the application of light from a xenon flash lamp to the wafer three times per introduction term of respective gaseous materials A and B into the reaction chamber, and changing the wafer temperature in association with the introduction terms of respective gaseous material A and B.

According to the procedure shown in FIG. 11, formation of a multilayered film in which plural atomic layers of one substance A are arranged alternately with plural atomic layers of another substance B at an interval of some number of layers is possible by controlling the wafer temperature in association with the introduction of gaseous material into reaction chamber 1 to be entirely adsorbed on the whole surface of sample 7.

In the present invention, it is preferable that the pulse interval is more than the time required for gaseous material to be entirely adsorbed into the whole surface of sample 7. Further, it is preferable that the application of pulse waveform light to sample 7 after the interchange of one gaseous material A with another gaseous material is carried out after the lapse of the time required for another gaseous material B to be entirely adsorbed into the whole surface of the sample.

The above-mentioned examples are examples in which a multilayered structure comprised of different material layers is formed in the same reaction chamber. However, the multilayered structure can be formed by using some number of reaction chambers communicating with each other properly corresponding to substances to deposited.

FIG. 13 is a graphical representation of a time schedule for the application of pulse waveform light to a monocrystal silicon wafer, the introduction of gaseous material A into the reaction chamber, and the introduction of gaseous material B into the reaction chamber, together with an output of pulse waveform light, flow of gaseous material A, flow of gaseous material B, and change of the wafer temperature with time. The graph illustrated an example procedure for forming a film including three alternately superimposed layers of substance B on three layers of substance A on the wafer. This film is formed by forming a layer of substance A according to a conventional vapor deposition method without applying pulse waveform light to the wafer and forming plural layers of substance B on the layer of substance A by applying pulse waveform light to the wafer according to the present invention.

Figure 14:
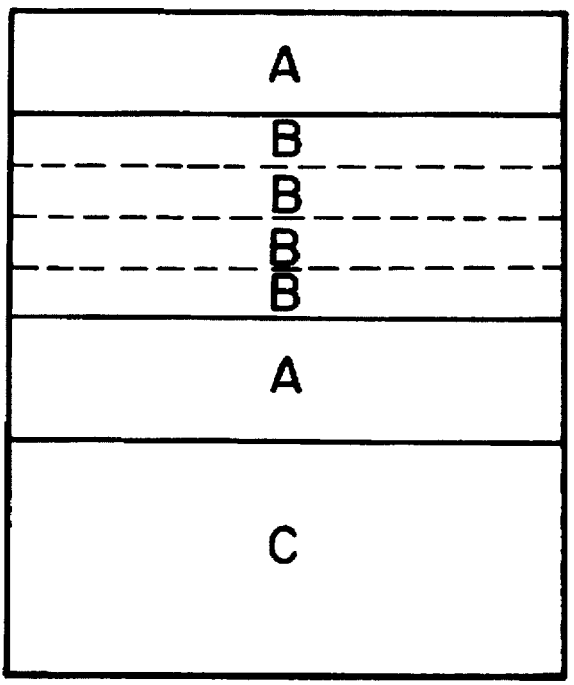
FIG. 14 is a sectional view of the multiatomic layered film formed on a wafer according the procedure shown in FIG. 13.

According to the procedure in FIG. 13, a multilayered structure can be formed as shown FIG. 14 in which A designates a film formed by conventional chemical vapor deposition and B designates a film formed by applying light from flash lamp 9 to sample 7 according to the present invention and C designates a wafer. This procedure combines the formation of film by a conventional vapor deposition with the above-mentioned method.

Further in the procedure shown in FIG. 13, it is apparent that it is possible to combine the device for forming a film without using a flash lamp with the reaction chamber using the flash lamp.

While the principles of the invention have been described above in connection with specific embodiments, and particular modifications thereof, it is to be clearly understood that this description is made only by way of example and not as a limitation on the scope of invention.

What is claimed is:

1. A vapor deposition method comprising; placing a sample in a reaction chamber; introducing at least one hydride gaseous material in the reaction chamber at a partial pressure such that the hydride gaseous material is adsorbed over substantively the whole entire surface of said sample; applying only one pulse of light from a flash lamp with the at least one hydride gaseous material kept introduced after waiting a preselected period of time to allow the gaseous material to be adsorbed over substantially the whole entire surface of the sample from the beginning of the introduction of the at least one hydride gaseous material; said pulse of the light from a flash lamp having a short pulse width relative to said preselected period of time such that the material adsorbed over substantively the whole surface of the sample is instantaneously decomposed; whereby one atomic layer of material is produced.

2. The vapor deposition method according to claim 1 wherein said step of introducing at least one gaseous material comprises introducing a plurality of gaseous materials whereby an atomic layer of mixed crystals is produced from said plurality of gaseous materials.

3. The vapor deposition method according to claim 2 wherein said steps of waiting a predetermined period of time and applying only one pulse of light of a pulsed waveform light from a flash lamp are repeated a plurality of times at preselected intervals to produce a plurality of atomic layers.

4. The vapor deposition method according to claim 1 including introducing an at least one gaseous material before introducing the at least one gaseous material at a partial pressure such that the gaseous material is adsorbed over substantially the whole surface of the sample; heating the sample at a constant temperature during the introduction of said an at least one gaseous material; whereby an atomic layer of said an at least one gaseous material is chemically formed before the at least one gaseous material at high partial pressure is introduced.

5. The vapor deposition method according to claim 1 including introducing an at least one gaseous material after introducing the at least one gaseous material at a partial pressure such that the gaseous material is adsorbed over substantially the whole surface of the sample and applying said one pulse of light to the sample; heating the sample at a constant temperature during the introduction of said an at least one gaseous material; whereby an atomic layer of said an at least one gaseous material is chemically formed after applying said one pulse of light to said sample.

6. The vapor deposition method according to claim 3 including selectively interchanging said at least one gaseous material with at least one different gaseous material after applying only one pulse of light from a pulsed waveform light source; said at least one different gaseous material being introduced at a partial pressure such that at least one different gaseous material is adsorbed over substantially the whole entire surface of said sample whereby different atomic layers are selectively produced.

7. The vapor deposition method according to claim 1 wherein said steps of waiting a predetermined period of time and applying only one pulse of light of a pulsed waveform light from a flash lamp are repeated a plurality of times at preselected intervals to produce a plurality of atomic layers.

8. The vapor deposition method according to claim 7 including selectively interchanging said at least one gaseous material with at least one different gaseous material after applying one pulse of light from a pulsed waveform light source; said at least one different gaseous material being introduced at a partial pressure such that at least one different gaseous material is entirely absorbed over substantially the whole surface of said sample whereby different atomic layers are selectively produced.

9. The vapor deposition method according to claim 1 wherein said one atomic layer of material produced is one atomic layer of an elemental semiconductor.

10. The vapor deposition method according to claim 9 wherein said one atomic elemental semiconductor layer is selected from the group consisting of germanium and silicon.

11. The vapor deposition method according to claim 10 wherein said partial pressure of said at least one gaseous material is in the range of 1 to 20 Pa.

12. The vapor deposition method according to claim 11 wherein said partial pressure of said at least one reaction gas is approximately 13 Pa.

13. The vapor deposition method according to claim 1 wherein said time period is at least 10 seconds.

14. The vapor deposition method according to claim 13 wherein said time period is between 20 and 40 seconds.

* * * * *

UNITED STATES PATENT AND TRADEMARK OFFICE
CERTIFICATE OF CORRECTION

PATENT NO. : 5,705,224
DATED : January 6, 1998
INVENTOR(S) : Junichi Murota et al.

It is certified that error appears in the above-identified patent and that said Letters Patent is hereby corrected as shown below:

Column 1, line 32 after "including" delete ".";

Column 6 and 7 in Equations (3) and (4)
delete $\{1 - \exp[-k_{MH_4}P_{MH_4} + k_{-MH_4})t]\}$ and
insert $\{1 - \exp[-(k_{MH_4}P_{MH_4} + k_{-MH_4})t]\}$ and;

Column 7, line 62 change "With" to --with--.

Signed and Sealed this

Fifth Day of May, 1998

Attest:

*Attesting Officer*

BRUCE LEHMAN

*Commissioner of Patents and Trademarks*